(12) United States Patent
Li et al.

(10) Patent No.: US 10,896,107 B1
(45) Date of Patent: Jan. 19, 2021

(54) BACKPLANE TESTING SYSTEM AND METHOD THEREOF

(71) Applicants: Inventec (Pudong) Technology Corporation, Shanghai (CN); Inventec Corporation, Taipei (TW)

(72) Inventors: Xiao-Qian Li, Shanghai (CN); Hui Yun, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/905,807

(22) Filed: Jun. 18, 2020

(30) Foreign Application Priority Data

Jun. 15, 2020 (CN) .......................... 2020 1 0543635

(51) Int. Cl.
*G06F 11/22* (2006.01)
(52) U.S. Cl.
CPC ...... *G06F 11/2221* (2013.01); *G06F 11/2273* (2013.01)
(58) Field of Classification Search
CPC .................. G06F 11/2221; G06F 11/2273
See application file for complete search history.

(56) References Cited

U.S. PATENT DOCUMENTS 5,838,899 A * 11/1998 Leavitt ................ G06F 11/1625
714/56
6,038,687 A * 3/2000 Ho ...................... G06F 11/2221
714/30

(Continued)

FOREIGN PATENT DOCUMENTS

CN  104655951 A  *  5/2015
CN  106502844 A  *  3/2017

(Continued)

OTHER PUBLICATIONS

Eklow, Bill et al., "IEEE 1149.6: A Boundary-Scan Standard for Advanced Digital Networks", Sep. 2003, IEEE Design & Test of Computers, pp. 76-83 (Year: 2003).*

(Continued)

*Primary Examiner* — Matthew M Kim
*Assistant Examiner* — Indranil Chowdhury
(74) *Attorney, Agent, or Firm* — David R. Stevens; Stevens Law Group

(57) ABSTRACT

A backplane testing system is provided. Based on the connection relationship and signal transfer relationship of a differential signal transceiver, a backplane and a loop device, the differential signal transceiver generates a set of pseudo random binary sequence (PRBS) as a differential signal, and sends the differential signal and receives the returned differential signal, and then determines whether the differential signals sent and received are the same; and the differential signal transceiver generates a test signal that conforms to the IEEE-1149.6 boundary scan test standard, and sends the test signal and receives the returned test signal through a second positive differential signal circuit and a second negative differential signal circuit, and then determines whether the test signals sent and received through the second positive differential signal circuit are the same and whether the test signals sent and received through the second negative differential signal circuit are the same.

10 Claims, 2 Drawing Sheets

(56) References Cited

U.S. PATENT DOCUMENTS

| | | | |
|---|---|---|---|
| 2002/0188786 A1* | 12/2002 | Barrow | G06F 13/38 |
| | | | 710/300 |
| 2003/0196144 A1* | 10/2003 | Swoboda | G06F 9/30141 |
| | | | 714/34 |
| 2004/0199353 A1* | 10/2004 | Bingham | G06F 11/2221 |
| | | | 702/122 |
| 2006/0255832 A1* | 11/2006 | Speers | H03K 19/1776 |
| | | | 326/39 |
| 2010/0057393 A1* | 3/2010 | Einsweiler | G06F 11/2221 |
| | | | 702/108 |
| 2012/0290889 A1* | 11/2012 | Klein | G06F 11/261 |
| | | | 714/719 |
| 2014/0156986 A1* | 6/2014 | Sun | G06F 1/184 |
| | | | 713/100 |
| 2016/0266204 A1* | 9/2016 | Chandra | G06F 11/2221 |
| 2017/0059656 A1* | 3/2017 | Chandra | G06F 11/00 |
| 2020/0132769 A1* | 4/2020 | Sang | G01R 31/318597 |

FOREIGN PATENT DOCUMENTS

| | | | | |
|---|---|---|---|---|
| EP | 0067510 B1 | * | 6/1988 | ........ G01R 19/16557 |
| JP | 6689289 B2 | * | 4/2020 | ...... H03K 19/018514 |
| TW | 200905226 A | * | 2/2009 | |
| TW | 201017399 A | * | 5/2010 | |
| TW | 201101024 A | * | 2/2011 | |
| TW | 201520775 A | * | 6/2015 | |
| TW | I498577 B | * | 9/2015 | |

OTHER PUBLICATIONS

IEEE Standards Board, "IEEE Standard Test Access Port and Boundary-Scan Architecture", IEEE 1149.1a-1993, Jun. 1993, IEEE, pp. i-xii and 1-127 (Year: 1993).*

* cited by examiner

BACKPLANE TESTING SYSTEM AND METHOD THEREOF

CROSS-REFERENCE TO RELATED APPLICATION

This application claims the benefit of Chinese Application Serial No. 202010543635.1, filed Jun. 15, 2020, which is hereby incorporated herein by reference in its entirety.

BACKGROUND OF THE INVENTION

1. Field of the Invention

The present invention relates to a testing system and a method thereof. In particular, the invention pertains to a backplane testing system and a method thereof.

2. Description of the Related Art

In general, the traditional backplane testing method is implemented by using a server, a large number of hard disks with core testing chips and an interface card (I/F card). However, as the number of interfaces to be tested increases, the number of hard disks used increases, so that there is a problem of increased test costs using this method.

In addition, since the traditional backplane testing method requires the I/F card, it is difficult to support a test frequency for the differential signal of 2.5 Gbps or more (i.e., the test frequency is low). Moreover, the traditional backplane testing method cannot support differential signal circuits with capacitors or the backplane to be tested with the redriver circuit.

On top of that, the traditional backplane testing method cannot test a single line in the differential signal circuit. Furthermore, the traditional backplane testing method uses serial interfaces such as IIC and UART to control the cascaded hard disks, which has the problem of a slow test speed.

Therefore, it is really necessary to propose improved technical means to solve the above problems.

SUMMARY OF THE INVENTION

In order to solve the problems of the prior art, the present invention discloses a backplane testing system and a method thereof.

First, the present invention discloses the backplane testing system for testing a backplane, which including a plurality of serial attached small computer system interface (SAS) ports, a first positive differential signal circuit and a first negative differential signal circuit. The backplane testing system includes: a loop device and a core testing device. The loop device includes a plurality of dummy SAS units. The dummy SAS units are electrically connected to the SAS ports one-to-one. Each dummy SAS unit is configured to receive a differential signal or a test signal, which conforms to IEEE-1149.6 boundary scan test standard, from the corresponding SAS port, and sends the differential signal or the test signal back to the corresponding SAS port. The core testing device includes a joint test action group (JTAG) interface, a control module and a differential signal transceiver, wherein the JTAG interface is connected to the loop device, the control module is connected to the JTAG interface, and the differential signal transceiver is connected to the control module. The control module is configured to send a first control command and a second control command, and control the dummy SAS units in parallel through the JTAG interface. The differential signal transceiver includes a second positive differential signal circuit and a second negative differential signal circuit, wherein the first positive differential signal circuit connects the second positive differential signal circuit and one SAS port, and the first negative differential signal circuit connects the second negative differential signal circuit and another SAS port. When the differential signal transceiver generates a set of pseudo-random binary sequence (PRBS) as the differential signal after receiving the first control command, the differential signal transceiver sends the differential signal to the backplane through the second positive differential signal circuit and the second negative differential signal circuit, receives the returned differential signal based on connection relationship and signal transmission relationship of the differential signal transceiver, the backplane and the loop device, and determines whether the differential signal sent and the differential signal received are the same. When the differential signal transceiver receives the second control command and generates the test signal that conforms to the IEEE-1149.6 boundary scan test standard, sends the test signal through the second positive differential signal circuit and the second negative differential signal circuit, and receives the returned test signal through the second positive differential signal circuit and the second negative differential signal circuit based on the connection relationship and signal transmission relationship of the differential signal transceiver, the backplane and the loop device, respectively, and determines whether the test signal sent and the test signal received through the second positive differential signal circuit are the same and whether the test signal sent and the test signal received through the second negative differential signal circuit are the same.

In addition, the present invention discloses the backplane testing method, comprising the following steps of: providing a backplane and a backplane testing system, wherein the backplane includes a plurality of SAS ports, a first positive differential signal circuit and a first negative differential signal circuit, the backplane testing system includes a loop device and a core testing device, the loop device includes a plurality of dummy SAS units, the plurality of dummy SAS units are electrically connected to the plurality of SAS ports one-to-one, each dummy SAS unit is configured to receive a differential signal or a test signal, which conforms to IEEE-1149.6 boundary scan test standard, from the corresponding SAS port, and sends the differential signal or the test signal back to the corresponding SAS port, the core testing device includes a control module, a differential signal transceiver, and a JTAG interface, the JTAG interface is connected to the loop device, the control module is connected to the JTAG interface, the differential signal transceiver is connected to the control module, the differential signal transceiver includes a second positive differential signal circuit and a second negative differential signal circuit, the first positive differential signal circuit is connected to the second positive differential signal circuit and one of the plurality of SAS ports, the first negative differential signal circuit connects the second negative differential signal circuit and another of the plurality of SAS ports; controlling, by the control module, the plurality of dummy SAS units in parallel through the JTAG interface; sending, by the control module, the a first control command to the differential signal transceiver; when the differential signal transceiver receiving the first control command and generating a set of PRBS as the differential signal, the differential signal transceiver sending the differential signal to the backplane through the second positive differential signal circuit and the second negative differential signal circuit, and receiving the returned differential signal based on connection relationship and signal transmission relationship of the differential signal transceiver, the backplane and the loop device, and determining whether the differential signal sent and the differential signal received are the same; sending, by the control module, a second control command to the differential signal transceiver; and when the differential signal transceiver receiving the second control command and generating the test signal that conforming to the IEEE-1149.6 boundary scan test standard, the differential signal transceiver sending the test signal through the second positive differential signal circuit and the second negative differential signal circuit respectively, and receiving the returned test signal through the second positive differential signal circuit and the second negative differential signal circuit based on the connection relationship and the signal transmission relationship of the differential signal transceiver, the backplane and the loop device respectively, and determining whether the test signal sent and the test signal received through the second positive differential signal circuit are the same and whether the test signal sent and the test signal received through the second negative differential signal circuit are the same.

The system and method disclosed in the present invention are as above, and the differences from the prior art are that based on the connection relationship and signal transfer relationship of a differential signal transceiver, a backplane and a loop device, the differential signal transceiver generates a set of pseudo random binary sequence (PRBS) as a differential signal, and sends the differential signal and receives the returned differential signal, and then determines whether the differential signals sent and received are the same; and the differential signal transceiver generates a test signal that conforms to the IEEE-1149.6 boundary scan test standard, and sends the test signal and receives the returned test signal through a second positive differential signal circuit and a second negative differential signal circuit, and then determines whether the test signals sent and received through the second positive differential signal circuit are the same and whether the test signals sent and received through the second negative differential signal circuit are the same.

By the above technical means, the present invention can only use a single core testing device to solve the problem of excessive testing cost caused by the traditional backplane testing system requiring a large number of hard disks with core testing chips. Moreover, the data transmission pressure test of the backplane differential signal circuit is performed by the PRBS generated by the differential signal transceiver, and the open circuit or short circuit test of the backplane differential signal circuit is performed by the boundary scan method, so as to achieve the technical effect of improving the test coverage rate. In addition, the present invention can support the backplane with redriver circuit for testing. Besides, the control module of the present invention can use the JTAG interface to control the dummy SAS units in parallel to improve the test speed. Furthermore, the present invention uses the loop device to replace the I/F card of the traditional backplane testing system, which makes the circuits shorter and the connection more reliable, so that the present invention can support the test frequency for the differential signal of 12 Gbps.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
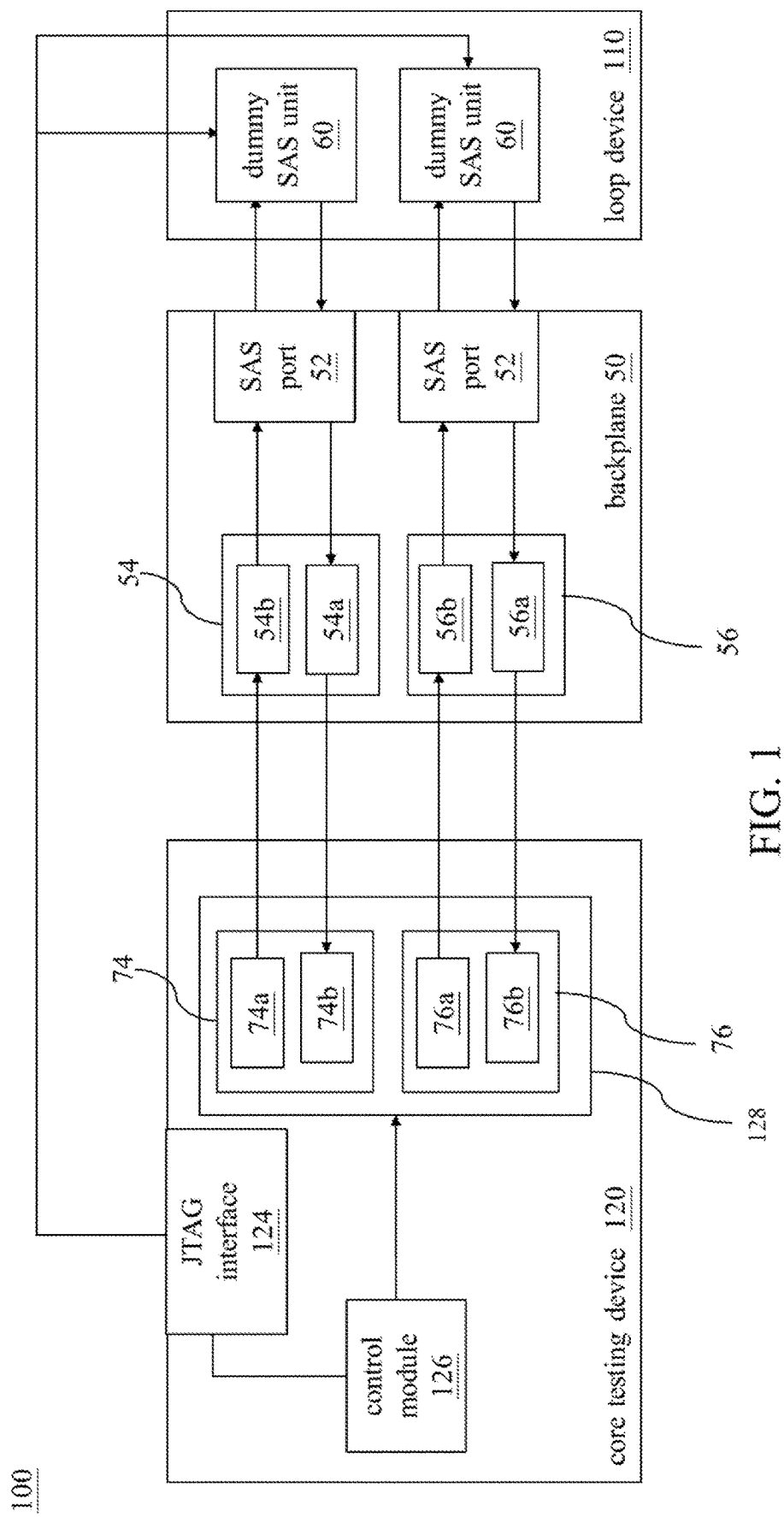
FIG. 1 is a system block diagram of an embodiment of a backplane testing system of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise", "include" and "have", and variations such as "comprises", "comprising", "includes", "including", "has" and "having" will be acknowledged to imply the inclusion of stated elements but not the exclusion of any other elements.

Please refer to FIG. 1, which is a system block diagram of an embodiment of a backplane testing system of the present invention. The backplane testing system 100 can be configured to test the backplane 50, wherein the backplane 50 can include a plurality of SAS ports 52, a first positive differential signal circuit 54 and a first negative differential signal circuit 56. In this embodiment, the backplane 50 may include but is not limited to two SAS ports 52.

In this embodiment, the backplane testing system 100 may include: a loop device 110 and a core testing device 120. The loop device 110 includes a plurality of dummy SAS units 60, and the dummy SAS units 60 are electrically connected to the SAS ports 52 one-to-one. In other words, the number of dummy SAS units 60 is the same as the number of SAS ports 52, and the dummy SAS units 60 correspond to different SAS ports 52. In this embodiment, the number of dummy SAS units 60 is two. Each dummy SAS unit 60 can be configured to receive a differential signal or a test signal conforming to the IEEE-1149.6 boundary scan test standard, from the corresponding SAS port 52, and send the differential signal or the test signal back to the corresponding SAS port 52. In other words, each dummy SAS unit 60 has the characteristic of sending back the signal it receives.

In this embodiment, the core testing device 120 may include a JTAG interface 124, a control module 126, and a differential signal transceiver 128. The JTAG interface 124 is connected to the loop device 110, and the control module 126 is connected to the JTAG interface 124. The signal transceiver 128 is connected to the control module 126.

The differential signal transceiver 128 includes a second positive differential signal circuit 74 and a second negative differential signal circuit 76, the first positive differential signal circuit 54 connects the second positive differential signal circuit 74 and one SAS port 52, the first negative differential signal circuit 56 connects the second negative differential signal circuit 76 and the other SAS port 52. In more detail, the first positive differential signal circuit 54 includes a first positive differential signal transmitting unit 54a and a first positive differential signal receiving unit 54b, and the first negative differential signal circuit 56 includes a first negative differential signal transmitting unit 56a and a first A negative differential signal receiving unit 56b, the second positive differential signal circuit 74 includes a second positive differential signal transmitting unit 74a and a second positive differential signal receiving unit 74b, and the second negative differential signal circuit 76 includes a second negative differential signal transmitting unit 76a and a second negative differential signal receiving unit 76b, wherein the first positive differential signal transmitting unit 54a is connected to the second positive differential signal receiving unit 74b, the first positive differential signal receiving unit 54b is connected to the second positive differential signal transmitting unit 74a, the first positive differential signal transmitting unit 54a and the first positive differential signal receiving unit 54b are connected to one SAS port 52, the first negative differential signal transmitting unit 56a is connected to the second negative differential signal receiving unit 76b, and the first negative differential signal receiving unit 56b is connected to the second negative differential signal transmitting unit 76a, and the first negative differential signal transmitting unit 56a and the first negative differential signal receiving unit 56b are connected to the other SAS port 52. The first positive differential signal sending unit 54a and the second positive differential signal sending unit 74a are configured to send the positive differential signal, and the first positive differential signal receiving unit 54b and the second positive differential signal receiving unit 74b are configured to receive the positive differential signal. The first negative differential signal transmitting unit 56a and the second positive differential signal transmitting unit 76a are configured to transmit the negative differential signal, and the first negative differential signal receiving unit 56b and the second negative differential signal receiving unit 76b are configured to receive the negative differential signal.

In this embodiment, any one of the JTAG interface 124, the control module 126, and the differential signal transceiver 128 can use a wired method to transfer signals and data. In actual implementation, the control module 126 may be generated by one or more general-purpose or special-purpose programmable microprocessors executing software or firmware stored in a machine-readable storage medium.

Figure 2:
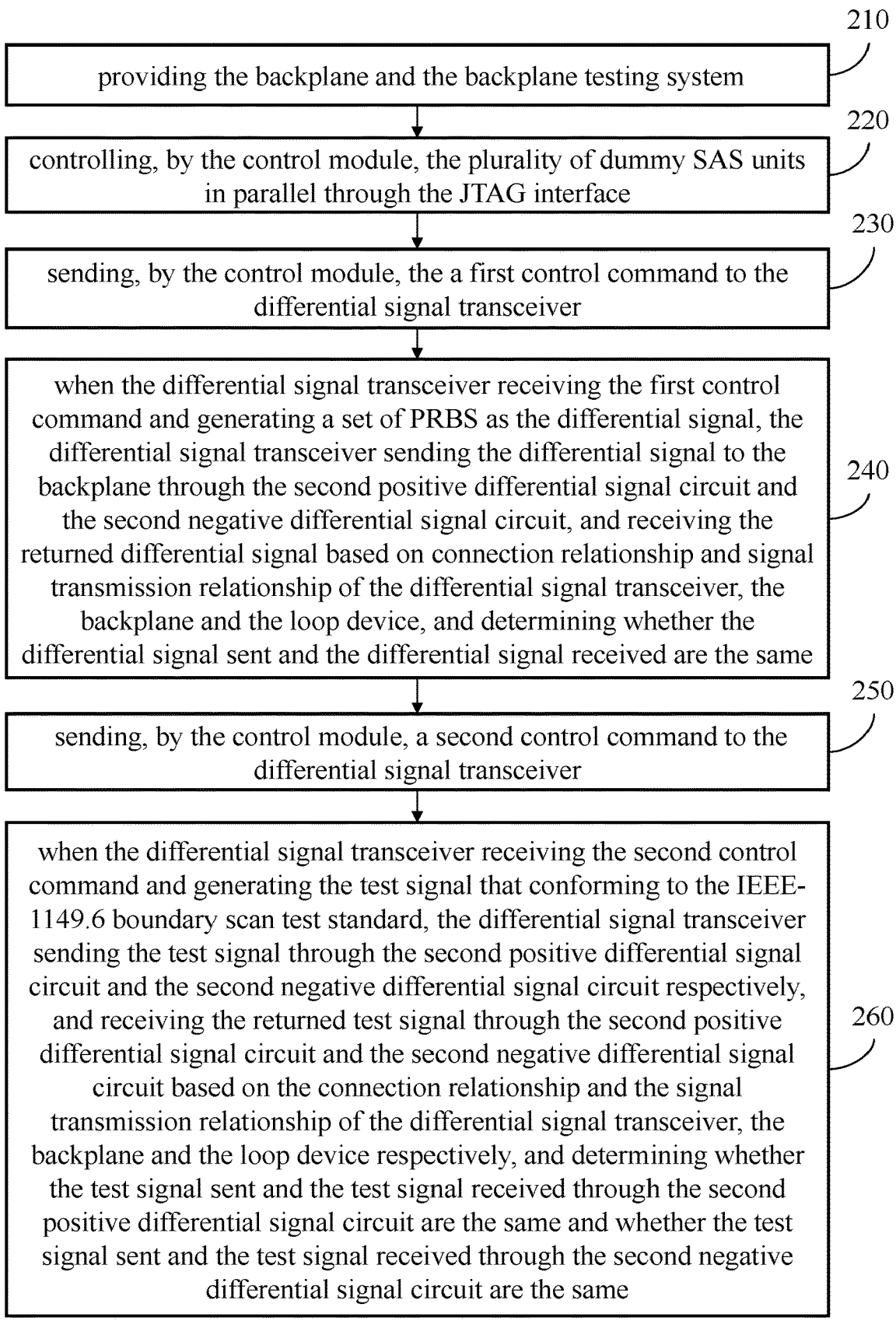
FIG. 2 is a flowchart of an embodiment of a backplane testing method performed by the backplane testing system of FIG. 1.

Next, please refer to FIG. 2, which is a flowchart of an embodiment of a backplane testing method performed by the backplane testing system of FIG. 1. The backplane testing method comprising the steps of: providing the backplane and the backplane testing system (step 210); controlling, by the control module, the plurality of dummy SAS units in parallel through the JTAG interface (step 220); sending, by the control module, the a first control command to the differential signal transceiver (step 230); when the differential signal transceiver receiving the first control command and generating a set of PRBS as the differential signal, the differential signal transceiver sending the differential signal to the backplane through the second positive differential signal circuit and the second negative differential signal circuit, and receiving the returned differential signal based on connection relationship and signal transmission relationship of the differential signal transceiver, the backplane and the loop device, and determining whether the differential signal sent and the differential signal received are the same (step 240); sending, by the control module, a second control command to the differential signal transceiver (step 250); and when the differential signal transceiver receiving the second control command and generating the test signal that conforming to the IEEE-1149.6 boundary scan test standard, the differential signal transceiver sending the test signal through the second positive differential signal circuit and the second negative differential signal circuit respectively, and receiving the returned test signal through the second positive differential signal circuit and the second negative differential signal circuit based on the connection relationship and the signal transmission relationship of the differential signal transceiver, the backplane and the loop device respectively, and determining whether the test signal sent and the test signal received through the second positive differential signal circuit are the same and whether the test signal sent and the test signal received through the second negative differential signal circuit are the same (step 260).

In step 220, since the control module 126 controls the dummy SAS units 60 in parallel through the JTAG interface 124, the test speed can be increased.

In step 240, since the differential signal may be composed of a positive differential signal and a negative differential signal, the differential signal transceiver 128 needs to send the differential signal through the second positive differential signal transmission unit 74a of the second positive differential signal circuit 74 and the second negative differential signal transmission unit 76a of the second negative differential signal circuit 76 to the first positive differential signal receiving unit 54b of the first positive differential signal circuit 54 and the first negative differential signal receiving unit 56b of the first negative differential signal circuit 56, and the first positive differential signal receiving unit 54b of the first positive differential signal circuit 54 and the first negative differential signal receiving unit 56b of the first negative differential signal circuit 56 can transmit the received differential signal to the corresponding SAS ports 52, which can transmit the differential signal they receives to the corresponding dummy SAS units 60, and the dummy SAS units 60 receive the differential signal and sending the received differential signal to the corresponding SAS ports 52 based on their characteristics of returning the signals they receive, and the SAS ports 52 can transmit the differential signal returned by the dummy SAS units 60 to the corresponding first positive differential signal transmission unit 54a of the first positive differential signal circuit 54 and the first negative differential signal transmission unit 56a of the first negative differential signal circuit 56, and the first positive differential signal transmission unit 54a of the first positive differential signal circuit 54 and the first negative differential signal transmission unit 56a of the first negative differential signal circuit 56 transmit the differential signal returned by the dummy SAS units 60 to the second positive differential signal receiving unit 74b of the second positive differential signal circuit 74 and the second negative differential signal receiving unit 76b of the second negative differential signal circuit 76.

Next, the differential signal transceiver 128 can compare the differential signal it sends and the differential signal it receives to determine whether the differential signal it sends and the differential signal it receives are the same. If the differential signal transceiver 128 determines that the differential signal it sends is different from the received differential signal, it can only determine that the backplane 50 fails to pass the test. But the differential signal transceiver 128 cannot determine whether the first positive differential signal circuit 54 has an abnormal state, or whether the first negative differential signal circuit 56 has an abnormal state, or whether the first positive differential signal circuit 54 and the first negative differential signal circuit 56 have abnormal status.

In addition, in this step, the test frequency of the differential signal can be adjusted to perform the data transmission stress test. In this embodiment, the backplane testing system 100 can support the test frequency of the differential signal of 12 Gbps by the design of the loop device 110 and the core testing device 120 described above.

Steps 250 and 260 can be configured to solve the above-mentioned problems. The differential signal transceiver 128 can determine whether the first positive differential signal circuit 54 and/or the first negative differential signal circuit 56 is/are abnormal by the boundary scan method. In step 260, the differential signal transceiver 128 generates the test signal, which conforms to the IEEE-1149.6 boundary scan test standard, after receiving the second control command from the control module 126. Since the test signal is a pulse signal, there is only a single line required for transmission. It is unlike a differential signal that is composed of the positive differential signal and the negative differential signal, and needs the differential line pair for transmission. Thus, the differential signal transceiver 128 can individually sends the test signal through the second positive differential signal transmission unit 74a of the second positive differential signal circuit 74 and the second negative differential signal transmission unit 76a of the second negative differential signal circuit 76. The test signal generated by the differential signal transceiver 128 can be simultaneously or differently sent to the first positive differential signal receiving unit 54b of the first positive differential signal circuit 54 and the first positive differential signal receiving unit 56b of the first negative differential signal circuit 56 through the second positive differential signal transmitting unit 74a of the second positive differential signal circuit 74 and the second negative differential signal transmitting units 76a of the second negative differential signal circuit 76. Then, the test signal can be sent back to the differential signal transceiver 128 through the first positive differential signal receiving unit 54b, the SAS port 52, the dummy SAS unit 60, the SAS port 52, the first positive differential signal transmitting unit 54a and the second positive differential signal receiving unit 74b, and the test signal can be sent back to the differential signal transceiver 128 through the first negative differential signal receiving unit 56b, the SAS port 52, the dummy SAS unit 60, the SAS port 52, the first negative differential signal transmitting unit 56a and the second negative differential signal receiving unit 76b.

Finally, the differential signal transceiver 128 compares the test signal sent and the test signal received through the second positive differential signal circuit 74 and then determines whether the test signal sent and the test signal received through the second positive differential signal circuit 74 are the same; and compares the test signal sent and the test signal received through the second negative differential signal circuit 76 and then determines whether the test signal sent and the test signal received through the second negative differential signal circuit 76 are the same. If the differential signal transceiver 128 determines that the test signal sent and the test signal received through the second positive differential signal circuit 74 are different, it is determined that the first positive differential signal circuit 54 has an abnormal state (when the first positive differential signal circuit 54 includes a capacitor, it is determined that the capacitor has an open circuit state; when the first positive differential signal circuit 54 does not include a capacitor, it is determined that the first positive differential signal circuit 54 has a short circuit state). If the differential signal transceiver 128 determines that the test signal sent and the test signal received through the second positive differential signal circuits 74 are the same, it is determined that the first positive differential signal circuit 54 is normal. If the differential signal transceiver 128 determines that the test signal sent and the test signal received through the second negative differential signal circuit 76 are different, it is determined that the first negative differential signal circuit 56 has an abnormal state (when the first negative differential signal circuit 56 includes a capacitor, it is determined that the capacitor has an open circuit state; when the first negative differential signal circuit 56 does not include a capacitor, it is determined that the first negative differential signal circuit 56 has a short circuit state). If the differential signal transceiver 128 determines that the test signal sent and the test signal received through the second negative differential signal circuit 76 are the same, it is determined that the first negative differential signal circuit 56 is normal.

Therefore, the backplane testing system 100 can perform the data transmission stress test of the differential signal circuit of the backplane (i.e. step 240), and perform the open circuit or short circuit test of the differential signal circuit of the backplane (i.e. step 260) based on the same system architecture, thereby improving test coverage rate.

In summary, it can be seen that the differences between the present invention and the prior art are that based on the connection relationship and signal transfer relationship of a differential signal transceiver, a backplane and a loop device, the differential signal transceiver generates a set of pseudo random binary sequence (PRBS) as a differential signal, and sends the differential signal and receives the returned differential signal, and then determines whether the differential signals sent and received are the same; and the differential signal transceiver generates a test signal that conforms to the IEEE-1149.6 boundary scan test standard, and sends the test signal and receives the returned test signal through a second positive differential signal circuit and a second negative differential signal circuit, and then determines whether the test signals sent and received through the second positive differential signal circuit are the same and whether the test signals sent and received through the second negative differential signal circuit are the same.

By the above-mentioned technical means, the present invention can solve the problem of excessive testing cost existing in the prior art. Moreover, the data transmission pressure test of the backplane differential signal circuit is performed by the PRBS generated by the differential signal transceiver, and the open circuit or short circuit test of the backplane differential signal circuit is performed by the boundary scan method, so as to achieve the technical effect of improving the test coverage rate. In addition, the present invention can support the backplane with redriver circuit for testing. Besides, the control module of the present invention can use the JTAG interface to control the dummy SAS units in parallel to improve the test speed. Furthermore, the present invention uses the loop device to replace the I/F card of the traditional backplane testing system, which makes the circuits shorter and the connection more reliable, so that the present invention can support the test frequency for the differential signal of 12 Gbps.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A backplane testing system for testing a backplane including a plurality of serial attached small computer system interface (SAS) ports, a first positive differential signal circuit, and a first negative differential signal circuit, the backplane testing system comprising:
   a loop device configured to include a plurality of dummy SAS units, the plurality of dummy SAS units being electrically connected to the plurality of SAS ports one-to-one, and each of the plurality of dummy SAS units being configured to receive a differential signal or a test signal conforming to IEEE-1149.6 boundary scan test standard, from the corresponding SAS port, and return the differential signal or the test signal to the corresponding SAS port; and
   a core testing device, comprising:
      a joint test action group (JTAG) interface configured to connect the loop device;
      a control module connected to the JTAG interface and configured to send a first control command and a second control command, and control the plurality of dummy SAS units in parallel through the JTAG interface; and
      a differential signal transceiver connected to the control module and configured to include a second positive differential signal circuit and a second negative differential signal circuit, the first positive differential signal circuit being connected to the second positive differential signal circuit and one of the plurality of SAS ports, the first negative differential signal circuit being connected to the second negative differential signal circuit and another of the plurality of SAS ports;
   wherein, when the differential signal transceiver receives the first control command and generates a set of pseudo-random binary sequence (Pseudo Random Binary Sequence, PRBS) as the differential signal, the differential signal transceiver sends the differential signal and receiving the returned differential signal based on connection relationship and signal transmission relationship of the differential signal transceiver, the backplane and the loop device, and then determines whether the differential signal sent and the differential signal received are the same;
   wherein, when the differential signal transceiver receives the second control command and generates the test signal conforming to the IEEE-1149.6 boundary scan test standard, the differential signal transceiver sends the test signal through the second positive differential signal circuit and the second negative differential signal circuit respectively, and receives the returned test signal through the second positive differential signal circuit and the second negative differential signal circuit respectively based on the connection relationship and the signal transfer relationship of the differential signal transceiver, the backplane and the loop device, and then determines whether the test signal sent and the test signal received through the second positive differential signal circuit are the same and whether the test signal sent and the test signal received through the second negative differential signal circuit are the same.

2. The backplane testing system according to claim 1, wherein the second positive differential signal circuit includes a second positive differential signal transmitting unit and a second positive differential signal receiving unit, and the second negative differential signal circuit includes a second negative differential signal transmitting unit and a second negative differential signal receiving unit.

3. The backplane testing system according to claim 1, wherein when the differential signal transceiver determines that the differential signal sent and the differential signal received are different, it is determined that the backplane fails to pass the test.

4. The backplane testing system according to claim 1, wherein when the differential signal transceiver determines that the test signal sent and the test signal received through the second positive differential signal circuit are different, it is determined that the first positive differential signal circuit has an abnormal state; and when the differential signal transceiver determines that the test signal sent and the test signal received through the second negative differential signal circuit are different, it is determined that the first negative differential signal circuit has an abnormal state.

5. The backplane testing system according to claim 1, wherein the backplane testing system supports a test frequency of the differential signal of 12 Gbps.

6. A backplane testing method, which comprising the following steps:
   providing a backplane and a backplane testing system, wherein the backplane includes a plurality of SAS ports, a first positive differential signal circuit and a first negative differential signal circuit, the backplane testing system includes a loop device and a core testing device, the loop device includes a plurality of dummy SAS units, the plurality of dummy SAS units are electrically connected to the plurality of SAS ports one-to-one, each of the plurality of dummy SAS unit is configured to receive a differential signal or a test signal, which conforms to IEEE-1149.6 boundary scan test standard, from the corresponding SAS port, and sends the differential signal or the test signal back to the corresponding SAS port, the core testing device includes a control module, a differential signal transceiver, and a JTAG interface, the JTAG interface is connected to the loop device, the control module is connected to the JTAG interface, the differential signal transceiver is connected to the control module, the differential signal transceiver includes a second positive differential signal circuit and a second negative differential signal circuit, the first positive differential signal circuit is connected to the second positive differential signal circuit and one of the plurality of SAS ports, the first negative differential signal circuit connects the second negative differential signal circuit and another of the plurality of SAS ports;

controlling, by the control module, the plurality of dummy SAS units in parallel through the JTAG interface;

sending, by the control module, the a first control command to the differential signal transceiver;

when the differential signal transceiver receiving the first control command and generating a set of PRBS as the differential signal, the differential signal transceiver sending the differential signal to the backplane through the second positive differential signal circuit and the second negative differential signal circuit, and receiving the returned differential signal based on connection relationship and signal transmission relationship of the differential signal transceiver, the backplane and the loop device, and determining whether the differential signal sent and the differential signal received are the same;

sending, by the control module, a second control command to the differential signal transceiver; and when the differential signal transceiver receiving the second control command and generating the test signal that conforming to the IEEE-1149.6 boundary scan test standard, the differential signal transceiver sending the test signal through the second positive differential signal circuit and the second negative differential signal circuit respectively, and receiving the returned test signal through the second positive differential signal circuit and the second negative differential signal circuit based on the connection relationship and the signal transmission relationship of the differential signal transceiver, the backplane and the loop device respectively, and determining whether the test signal sent and the test signal received through the second positive differential signal circuit are the same and whether the test signal sent and the test signal received through the second negative differential signal circuit are the same.

7. The backplane testing method according to claim 6, wherein the second positive differential signal circuit includes a second positive differential signal transmitting unit and a second positive differential signal receiving unit, and the second negative differential signal circuit includes a second negative differential signal transmitting unit and a second negative differential signal receiving unit.

8. The backplane testing method according to claim 6, wherein the backplane testing method further comprises the following steps: when the differential signal transceiver determines that the differential signal sent and the differential signal received are different, it is determined that the backplane fails to pass the test.

9. The backplane testing method according to claim 6, wherein the backplane testing method further comprises the following steps: when the differential signal transceiver determines that the test signal sent and the test signal received through the second positive differential signal circuit are different, it is determined that the first positive differential signal circuit has an abnormal state; and when the differential signal transceiver determines that the test signal sent and the test signal received through the second negative differential signal circuit are different, it is determined that the first negative differential signal circuit has an abnormal state.

10. The backplane testing method according to claim 6, wherein the backplane testing system supports a test frequency of the differential signal of 12 Gbps.

\* \* \* \* \*